(12) United States Patent
Kang et al.

(10) Patent No.: US 11,469,135 B2
(45) Date of Patent: Oct. 11, 2022

(54) SUBSTRATE PLACING PART THAT IS ARRANGED IN SUBSTRATE PROCESSING APPARATUS

(71) Applicant: JUSUNG ENGINEERING CO., LTD., Gwangju-si (KR)

(72) Inventors: Ho Chul Kang, Gwangju-si (KR); Chul Joo Hwang, Seongnam-si (KR)

(73) Assignee: JUSUNG ENGINEERING CO., LTD.

( * ) Notice: Subject to any disclaimer, the term of this patent is extended or adjusted under 35 U.S.C. 154(b) by 202 days.

(21) Appl. No.: 16/340,094

(22) PCT Filed: Oct. 11, 2017

(86) PCT No.: PCT/KR2017/011161
§ 371 (c)(1),
(2) Date: Apr. 5, 2019

(87) PCT Pub. No.: WO2018/070765
PCT Pub. Date: Apr. 19, 2018

(65) Prior Publication Data
US 2020/0027776 A1    Jan. 23, 2020

(30) Foreign Application Priority Data

Oct. 12, 2016   (KR) .......................... 10-2016-0131958

(51) Int. Cl.
*H05B 3/68*     (2006.01)
*H01L 21/687*   (2006.01)
*H01L 21/67*    (2006.01)

(52) U.S. Cl.
CPC .. *H01L 21/68785* (2013.01); *H01L 21/67103* (2013.01)

(58) Field of Classification Search
CPC ......... H01L 21/67103; H01L 21/67248; H01L 21/68785; H05B 3/00; H05B 3/0014;
(Continued)

(56) References Cited

U.S. PATENT DOCUMENTS 6,423,949 B1 *   7/2002   Chen ................. H01L 21/67103
                                                            118/725
2002/0043528 A1   4/2002   Ito
(Continued)

FOREIGN PATENT DOCUMENTS

JP       H097741 A      1/1997
JP     2003257593 A     9/2003
(Continued)

*Primary Examiner* — Sang Y Paik
(74) *Attorney, Agent, or Firm* — Renaissance IP Law Group LLP

(57) ABSTRACT

An embodiment of a substrate placing part relates to a substrate placing part that is arranged in a substrate processing apparatus. The substrate placing part is divided into a plurality of inner sections that have an inner heating wire and an outer heating wire; and an outer section that is arranged in an edge thereof, that surrounds the inner sections, and that includes the outer heating wire, wherein the inner heating wire is disposed in the same inner section and has a first gap in at least a partial section thereof, the respective inner heating wires disposed in the different inner sections are disposed to have a second gap in a part in which the inner heating wires are parallel to one another, the inner heating wire and the outer heating wire are disposed to have a third gap in a part in which the inner heating wire and the outer heating wire are parallel to one another, and the first gap may be smaller than the second gap.

8 Claims, 5 Drawing Sheets

(58) Field of Classification Search
CPC .. H05B 3/0019; H05B 3/0023; H05B 3/0038; H05B 3/0047; H05B 3/14; H05B 3/141; H05B 3/143; H05B 3/20; H05B 3/22; H05B 3/24; H05B 3/26; H05B 3/265; H05B 3/28; H05B 3/283; H05B 3/74; H05B 3/742; H05B 3/748; H05B 3/84; H05B 2203/00; H05B 2203/002; H05B 2203/003; H05B 2203/004; H05B 2203/005; H05B 2203/007; H05B 2203/037
USPC ........... 219/443.1–468.2, 520–522, 538–548
See application file for complete search history.

(56) References Cited

U.S. PATENT DOCUMENTS

| | | | |
|---|---|---|---|
| 2005/0258160 A1* | 11/2005 | Goto | H01L 21/67103 |
| | | | 219/270 |
| 2006/0186110 A1* | 8/2006 | Campello | H01L 21/67103 |
| | | | 219/444.1 |
| 2015/0114948 A1* | 4/2015 | Tiner | C23C 16/458 |
| | | | 219/448.11 |

FOREIGN PATENT DOCUMENTS

| | | |
|---|---|---|
| JP | 2005303014 A | 10/2005 |
| JP | 3198619 U | 7/2015 |
| KR | 20150037075 A | 4/2015 |
| KR | 20160049070 A | 5/2016 |
| KR | 20160109833 A | 9/2016 |

* cited by examiner

SUBSTRATE PLACING PART THAT IS ARRANGED IN SUBSTRATE PROCESSING APPARATUS

TECHNICAL FIELD

Embodiments relate to a susceptor disposed in a substrate processing apparatus, which improves the uniformity of the overall temperature, enables individual adjustment in the temperature of a peripheral region, and enables adjustment in the device characteristics of a finished substrate product via adjustment in the temperature of a corner region of a substrate.

BACKGROUND

The disclosure described in this part merely provides background information related to embodiments, and does not constitute the related art.

Generally, a semiconductor memory element, a liquid crystal display device, an organic light-emitting device, or the like is manufactured as a stack of structures having desired shapes by performing a plurality of semiconductor processes on a substrate.

Such semiconductor manufacturing processes include, for example, a process of depositing a predetermined thin film on the substrate, a photolithography process of exposing a selected area of the thin film, and an etching process of removing the selected area from the thin film. Processing of the substrate used for the manufacture of semiconductors is performed in a substrate processing apparatus, which includes a process chamber in which the optimum environment for the corresponding process is created.

Inside the process chamber, a substrate to be processed and a susceptor on which the substrate is seated are provided, and a process gas containing a source material is sprayed on the substrate. With the source material contained in the process gas, for example, the deposition process or the etching process is performed on the substrate.

Meanwhile, the susceptor may be heated in order to process the substrate, which needs to be improved because uneven heating may occur.

DISCLOSURE

Technical Problem

Accordingly, embodiments are directed to a susceptor disposed in a substrate processing apparatus, which improves the uniformity of the overall temperature, enables individual adjustment in the temperature of a peripheral region, and enables adjustment in the device characteristics of a finished substrate product via adjustment in the temperature of a corner region of a substrate.

The technical objects to be accomplished by the embodiments are not limited to the aforementioned technical object, and other unmentioned technical objects will be clearly understood from the following description by those having ordinary skill in the art.

Technical Solution

One embodiment provides a susceptor disposed in a substrate processing apparatus, wherein the susceptor is divided into a plurality of inner areas each having an inner heating wire and an outer heating wire and an outer area provided in an edge thereof so as to surround the inner areas and having the outer heating wire, wherein at least some portions of the inner heating wire are disposed in the same inner area at a first distance, wherein parallel portions of respective inner heating wires disposed in the different inner areas are disposed at a second distance, wherein parallel portions of the inner heating wire and the outer heating wire are disposed at a third distance, and wherein the first distance is less than the second distance.

Another embodiment provides a susceptor disposed in a substrate processing apparatus, wherein the susceptor is divided into a plurality of inner areas each having an inner heating wire and an outer heating wire and an outer area provided in an edge thereof so as to surround the inner areas and having the outer heating wire, wherein at least some portions of the inner heating wire are disposed in the same inner area at a first distance, wherein parallel portions of respective inner heating wires disposed in the different inner areas are disposed at a second distance, wherein parallel portions of the inner heating wire and the outer heating wire are disposed at a third distance, and wherein the first distance is equal to the third distance or less than the third distance.

A further embodiment provides a susceptor disposed in a substrate processing apparatus, wherein the susceptor is divided into a plurality of inner areas each having an inner heating wire and an outer heating wire and an outer area provided in an edge thereof so as to surround the inner areas and having the outer heating wire, wherein at least some portions of the inner heating wire are disposed in the same inner area at a first distance, wherein parallel portions of respective inner heating wires disposed in the different inner areas are disposed at a second distance, wherein parallel portions of the inner heating wire and the outer heating wire are disposed at a third distance, and wherein the second distance is equal to the third distance or greater than the third distance.

Advantageous Effects

In the embodiments, the entire area of a susceptor is maintained at a uniform temperature or with only very slight temperature variation therein, which improves the uniformity of the temperature of the entire susceptor.

In addition, the susceptor is divided into an outer area and an inner area, and in turn each of the outer area and the inner area is divided into a plurality of areas so that the temperatures of the respective areas may be individually adjusted.

In particular, since the outer areas of the susceptor may be individually adjusted, the temperature in corner portions of a substrate close to the outer areas may be easily adjusted, which enables the adjustment of device characteristics of a finished substrate product.

DETAILED DESCRIPTION

Figure 1:
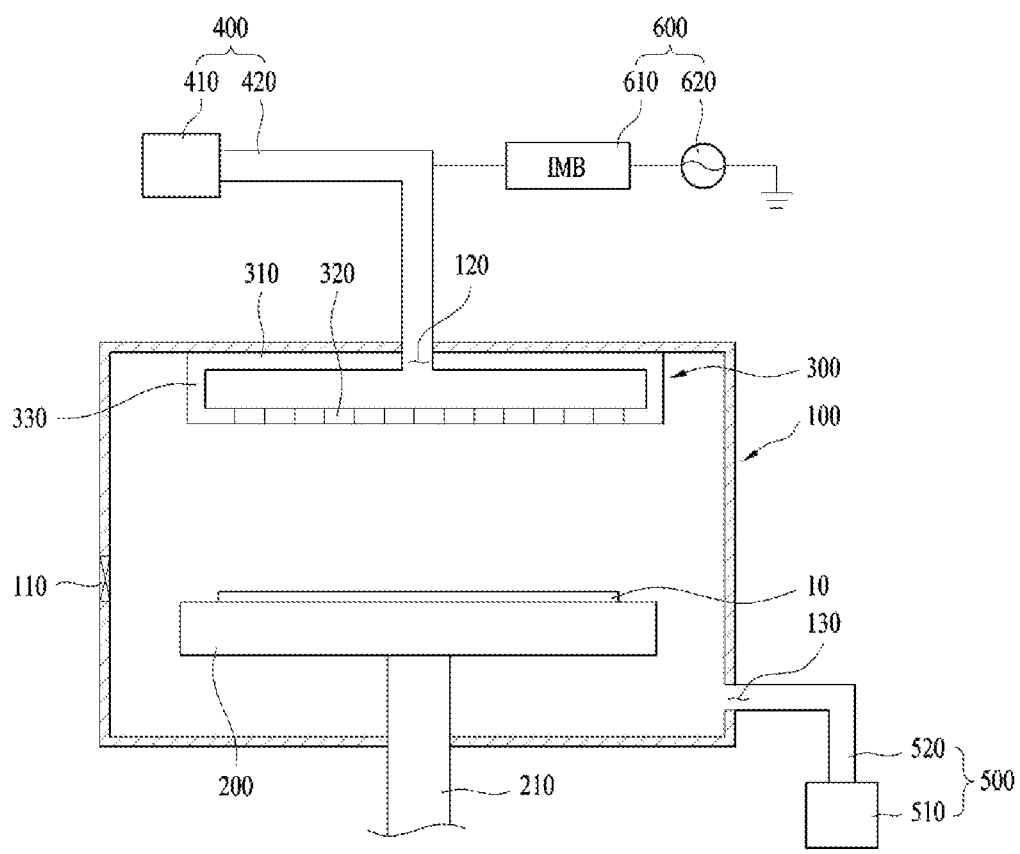
FIG. 1 is a view illustrating a substrate processing apparatus having a susceptor according to an embodiment.

Hereinafter, exemplary embodiments will be described in detail with reference to the accompanying drawings. While the exemplary embodiments are susceptible to various modifications and alternative forms, specific embodiments thereof are shown by way of example in the drawings and will herein be described in detail. It should be understood, however, that there is no intent to limit the embodiments to the particular forms disclosed, but on the contrary, the embodiments should be construed as including all modifications, equivalents, and alternatives falling within the spirit and scope of the embodiments.

Although terms such as, for example, "first" and "second" may be used to describe various elements, the components should be not limited by these terms. These terms are merely used to distinguish the same or similar elements from each other. In addition, the terms particularly defined in consideration of configurations and operations of the embodiments are merely provided to describe the embodiments, and are not intended to limit the scope of the embodiments.

In the description of the embodiments, it will be understood that, when an element such as a layer (film), region, pattern or structure is referred to as being formed "on" or "under" another element, such as a substrate, layer (film), region, pad or pattern, it can be directly "on" or "under" the other element or be indirectly formed with intervening elements therebetween. It will also be understood that "on" or "under" the element may be described relative to the drawings.

In addition, relative terms such as, for example, "first", "second", "on/upper/above" and "beneath/lower/below", used in the following description may be used to distinguish any one substance or element with another substance or element without requiring or containing any physical or logical relationship or sequence between these substances or elements.

FIG. 1 is a view illustrating a substrate processing apparatus having a susceptor according to an embodiment. The substrate processing apparatus may include a process chamber 100 having a reaction space and a susceptor 200 provided inside the process chamber 100 to support at least one substrate 10.

In addition, the substrate processing apparatus may further include a gas distribution device 300 provided inside the process chamber 100 at a side opposite the susceptor 200 to spray process gas and a gas supply unit 400 provided outside the process chamber 100 to supply the process gas to the gas distribution device 300. In addition, the substrate processing apparatus may further include an exhaust unit 500 configured to exhaust the interior of the process chamber 100.

The process chamber 100 may have a cylindrical shape defining the space for the deposition of the substrate 10 therein. The process chamber 100 may have any of various other shapes depending on the shape of the substrate 10.

The susceptor 200 and the gas distribution device 300 may be provided so as to face each other inside the process chamber 100. For example, the susceptor 200 may be provided in the lower region of the process chamber 100, and the gas distribution device 300 may be provided in the upper region of the process chamber 100.

In addition, the process chamber 100 may have a substrate opening 110 through which the substrate 10 is introduced or discharged. The process chamber 100 may further have a gas inlet port 120 connected to the gas supply unit 400, which supplies the process gas into the process chamber 100.

In addition, in order to adjust the pressure inside the process chamber 100 or to discharge the process gas, other foreign substances or the like inside the process chamber 100, the process chamber 100 may have an exhaust port 130, and the exhaust unit 500 may be connected to the exhaust port 130.

For example, the substrate opening 110 may be formed in one side surface of the process chamber 100 and may have a size suitable to enable the introduction or discharge of the substrate 10, the gas inlet port 120 may be formed in the upper wall of the process chamber 100, and the exhaust port 130 may be formed in the sidewall or the lower wall of the process chamber 100 at a position lower than that of the susceptor 200.

The susceptor 200 is provided inside the process chamber 100 so that at least one substrate 10 introduced into the process chamber 100 is seated on the susceptor 200. The susceptor 200 may be positioned so as to face the gas distribution device 300.

The susceptor 200 may have a substantially circular or rectangular plate shape when viewed in the vertical direction. In the following description, a susceptor 200 having a rectangular plate shape according to an embodiment will be described.

For example, the susceptor 200 may be provided in the lower region of the process chamber 100, and the gas distribution device 300 may be provided in the upper region of the process chamber 100.

An elevating device 210 may be provided below the susceptor 200 in order to move the susceptor 200 vertically. The elevating device 210 is provided to support at least one area of the susceptor 200, for example, a center area thereof, and moves the susceptor 200 toward the gas distribution device 300 once the substrate 10 has been seated on the susceptor 200.

In addition, a heating unit 700 may be mounted in the susceptor 200. The heating unit 700 may emit heat at a predetermined temperature so as to heat the substrate 10, which may allow, for example, a thin film deposition process or an etching process to be easily performed on the substrate 10. The structure and arrangement of the heating unit 700 will be described below in detail with reference to FIGS. 2 to 5.

The gas distribution device 300 is provided in the upper region of the process chamber 100 to spray the process gas toward the substrate 10 seated on the susceptor 200. The gas distribution device 300 may be manufactured into a shape corresponding to the shape of the substrate 10, and may have a substantially circular or rectangular shape, in the same manner as the susceptor 200.

Meanwhile, the gas distribution device 300 may include an upper plate 310, a shower head 320, and a sidewall plate 330. The upper plate 310 may be provided with the gas inlet port 120 and may be connected to the gas supply unit 400, in the same manner as the upper wall of the process chamber 100.

The shower head 320 may be spaced apart from the upper plate 310 by a predetermined distance in the vertical direction and may be provided with a plurality of spray holes therein. The sidewall plate 330 may be provided so as to hermetically seal the space between the upper plate 310 and the shower head 320.

The gas supply unit 400 may include a gas supply source 410 configured to supply a plurality of kinds of process gas respectively, and a gas supply pipe 420 configured to supply the process gas from the gas supply source 410 into the process chamber 100. The process gas may include, for example, thin film deposition gas or etching gas.

The exhaust unit 500 may include an exhaust device 510 and an exhaust pipe 520 connected to the exhaust port 130 of the process chamber 100. The exhaust device 510 may use, for example, a vacuum pump, and may be configured to enable vacuum suction of the interior of the process chamber 100 to a pressure close to a complete vacuum, for example, a pressure of 0.1 mTorr or less.

Meanwhile, the substrate processing apparatus may further include an RF power supply unit 600, which includes an RF power supply 620 and an impedance matching box (I.M.B.) 610. The RF power supply unit 600 may generate plasma in the process gas using the upper plate 310 as a plasma electrode.

To this end, the RF power supply 620 may be connected to the upper plate 310 to supply RF power, and the impedance matching box 610 may be located between the upper plate 310 and the RF power supply 620 to match impedances so as to enable the application of maximum power.

Figure 2:
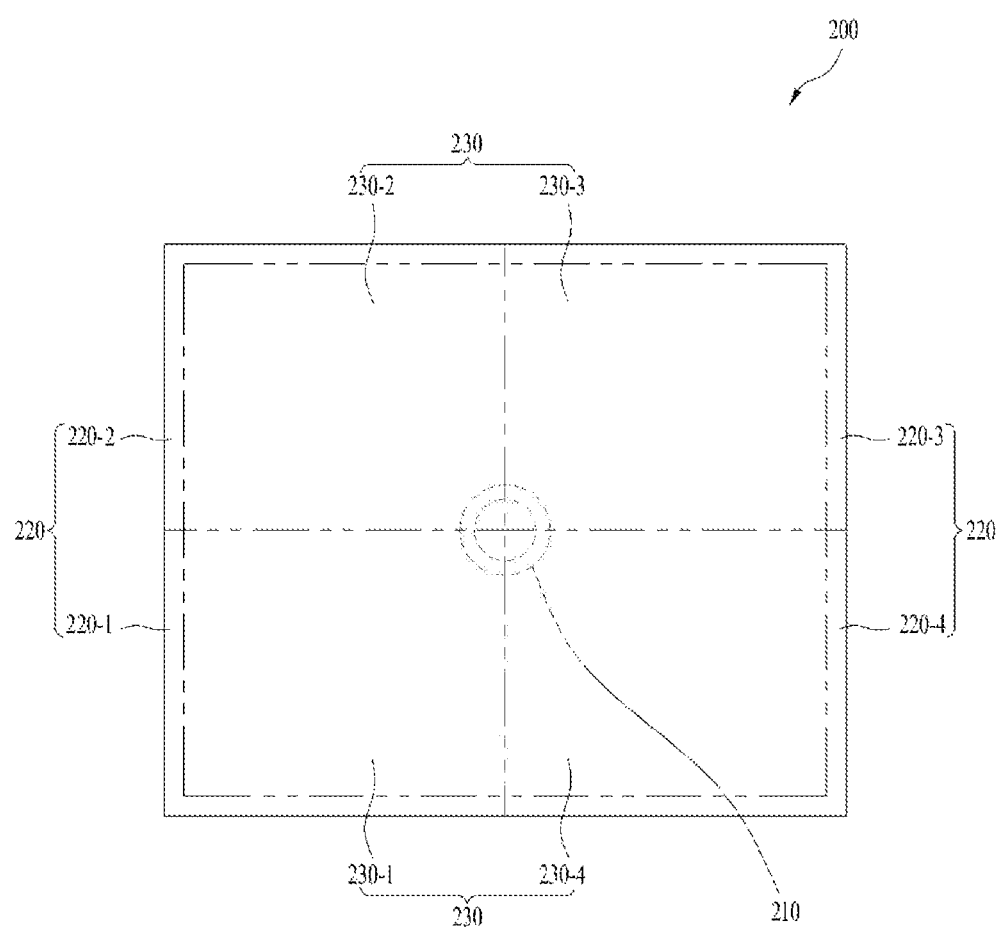
FIG. 2 is a view illustrating respective areas of the susceptor according to an embodiment.

FIG. 2 is a view illustrating respective areas of the susceptor 200 according to an embodiment. The heating unit 700 may need to be appropriately disposed in the susceptor 200 for uniform heating of the entire area thereof. Thus, for the arrangement of the heating unit 700, the susceptor 200 may need to be divided into a plurality of areas.

As illustrated in FIG. 2, in an embodiment, the susceptor 200 may be formed in a rectangular plate shape and may be divided into an inner area 230 and an outer area 220. Here, the term "divide" means that the entire area of the susceptor 200 is divided into a plurality of areas, but does not mean that the susceptor 200 is separated into a plurality of parts so that the respective parts are spaced apart from one another.

The inner area 230 may be provided in the center of the susceptor 200, and the outer area 220 may be provided in the edge of the susceptor 200 so as to surround the inner area 230.

Here, as illustrated in FIG. 2, the outer area 220 may include at least two outer areas provided in at least two corner portions of the susceptor 200, and, as will be described below, the respective outer areas 220 may be independently heated.

In addition, as will be described below, in the inner area 230, an inner heating wire 710 and a portion of an outer heating wire 720 may be provided, and the remaining portion of the outer heating wire 720 may be provided so as not to be heated. In addition, as will be described below, the outer heating wire 710 may be provided in the outer area 220.

As illustrated in FIG. 2, in an embodiment, since the susceptor 200 is formed into a rectangular plate shape, the inner area 230 may have a rectangular shape and the outer area 220 may have a rectangular outer contour and may have a rim shape excluding the inner area 230.

The inner area 230 may be divided into a plurality of areas, which are symmetrical to each other about the center of the susceptor 200. Here, the inner area 230 may be divided into quadrants or may be further divided.

For example, the inner area 230 may be divided into a total of four rectangular areas. That is, as illustrated in FIG. 2, the inner area 230 may be divided into a first inner area 230-1, a second inner area 230-2, a third inner area 230-3, and a fourth inner area 230-4.

The first inner area 230-1 to the fourth inner area 230-4 may be symmetrical to each other about the center of the susceptor 200. Here, for example, the elevating device 210 may be disposed so as to be coupled to the susceptor 200 at a position close to the center of the susceptor 200 at which the corner portions of the first inner area 230-1 to the fourth inner area 230-4 meet each other.

In the same manner, the outer area 220 may be divided into a plurality of areas, which are symmetrical to each other about the center of the susceptor 200. Here, the outer area 220 may be divided into quadrants or may be further divided.

That is, as illustrated in FIG. 2, the outer area 220 may be divided into a first outer area 220-1, a second outer area 220-2, a third outer area 220-3, and a fourth outer area 220-4. Here, as illustrated in FIG. 2, the first outer area 220-1 to the fourth outer area 220-4 may respectively include the respective corner portions of the susceptor 200, and may be provided in a bent shape in the respective corner portions.

Figure 3:
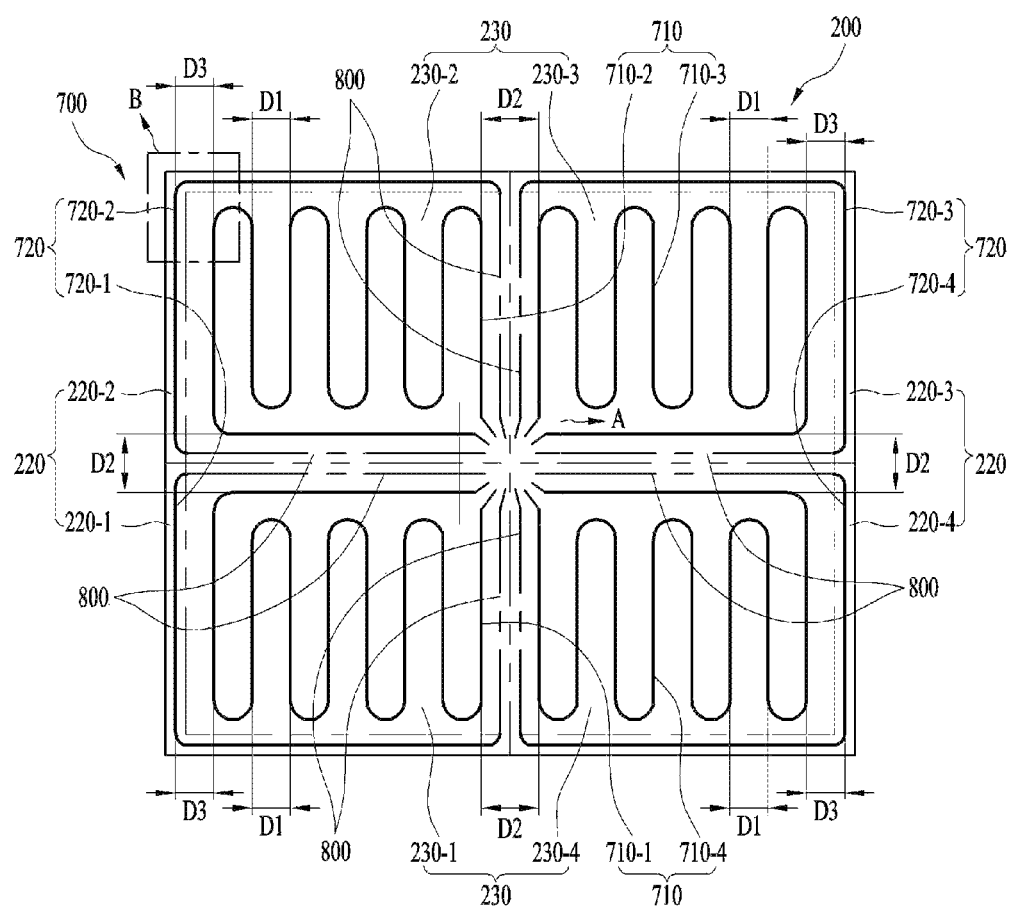
FIG. 3 is a view illustrating the arrangement of a heating unit of the susceptor according to an embodiment.

FIG. 3 is a view illustrating the arrangement of the heating unit 700 of the susceptor 200 according to an embodiment. In the embodiment, the heating unit 700 may be provided in a plural number in order to independently heat the inner areas 230 and the outer areas 220.

With this structure, the heating unit 700 may heat the susceptor 200 so that the entire area of the susceptor 200 has a uniform temperature or only very slight temperature variation therein.

Meanwhile, in the case in which the susceptor 200 is unevenly heated and thus has different local temperatures, the edge of the susceptor 200, more particularly, the corner portions of the edge of the susceptor 200 having a rectangular plate shape, may be considerably lower in temperature than the center of the susceptor 200.

That is, the edge and the corner portions of the susceptor 200 are located close to the outer wall of the process chamber 100, and therefore, may undergo thermal loss due to outside air. In addition, the corner portions have a surface area greater than that of the center portion due to the shape characteristics thereof, and therefore may undergo thermal loss.

When the susceptor 200 is unevenly heated, the substrate 10 disposed on the susceptor 200 may be unevenly heated. When a substrate manufacturing process is performed in the unevenly heated state of the substrate, this may cause defects in a finished substrate product and may deteriorate the device characteristics of the finished substrate product.

For the reasons described above, the susceptor 200 may need to be heated so as to have a uniform temperature over the entire area thereof Hereinafter, the concrete structure of the heating unit 700 for uniform heating of the susceptor 200 will be described.

As illustrated in FIG. 3, the heating unit 700 may include the inner heating wire 710 disposed in the inner areas 230 of the susceptor 200 and the outer heating wire 720 disposed in the outer areas 220. The heating unit 700 may include, for example, the inner heating wire 710 and the outer heating wire 720. The inner or outer heating wires may be configured as electric heating wires of an electric resistance heating type.

In addition, the heating unit 700 may be appropriately disposed on the region of the susceptor 200 excluding the upper surface on which the substrate 10 is seated. For example, the heating unit 700 may be appropriately disposed inside or below the susceptor 200 or on the lower surface of the susceptor 200.

The inner heating wire 710, as illustrated in FIG. 3, may be provided in a number and position corresponding to those of the respective divided inner areas 230 so as to independently heat the respective divided inner areas 230.

For example, the inner heating wire 710 may be disposed in a number corresponding to the number of inner areas 230 into which the susceptor 200 is divided, which is four. That is, the inner heating wire 710 may be divided into a first-first heating wire 710-1, a first-second heating wire 710-2, a first-third heating wire 710-3, and a first-fourth heating wire 710-4.

Here, the first-first heating wire 710-1 may be disposed in the first inner area 230-1 to heat the first inner area 230-1. In addition, the first-second heating wire 710-2 may be disposed in the second inner area 230-2 to heat the second inner area 230-2.

In addition, the first-third heating wire 710-3 may be disposed in the third inner area 230-3 to heat the third inner area 230-3. In addition, the first-fourth heating wire 710-4 may be disposed in the fourth inner area 230-4 to heat the fourth inner area 230-4.

The first-first heating wire 710-1 to the first-fourth heating wire 710-4 may independently heat the first inner area 230-1 to the fourth inner area 230-4. That is, the first-first heating wire 710-1 to the first-fourth heating wire 710-4 may be independently connected to an external power supply (not illustrated), and may independently receive power under the control of a control device (not illustrated), which controls the external power supply, to heat the first inner area 230-1 to the fourth inner area 230-4.

For example, the control device may control the external power supply to supply the same magnitude or different magnitudes of power to the first-first heating wire 710-1 to the first-fourth heating wire 710-4 so that the first inner area 230-1 to the fourth inner area 230-4 are heated to a uniform temperature, thereby allowing the entire inner area 230 to be heated to a uniform temperature.

At least a portion of the inner heating wire 710, i.e. a portion of the electric heating wire, may be disposed in a zigzag shape or a wavy shape. This is because the inner area 230 has a rectangular shape and the inner heating wire 710 takes the form of an electric heating wire in the embodiment, and therefore the electric heating wire needs to be disposed in a shape suitable for evenly heating the entire rectangle.

Meanwhile, although not illustrated, in another embodiment, the inner heating wires 710 may be provided in any of various other forms, such as a vortex shape, in the inner areas 230 so long as they can evenly heat the inner areas 230.

Meanwhile, the inner area 230 may be provided with non-heating portions in which no inner heating wire 710 is disposed on the division boundaries between the first inner area 230-1 to the fourth inner area 230-4. The non-heating portions may prevent the inner area 230 from being excessively heated, thereby preventing the entire susceptor 200 from being unevenly heated.

That is, since a cable 800, which is electrically connected to the outer heating wire 720 and the external power supply, may be disposed on the boundary, the entire inner area 230 may be excessively heated when the boundary is heated. Therefore, the boundary may be appropriately formed as a non-heating portion in order to prevent the problem described above.

The non-heating portion may be, for example, provided to prevent a portion of the outer heating wire 720, which is located in the inner area, from being heated. To this end, a portion of the outer heating wire 720 that is not heated may be configured as the cable 800 for electrical connection, rather than being configured as an electric heating wire.

With the provision of the non-heating portion, the outer heating wire in at least one inner area 230, i.e. a portion of the cable 800, may remain at a temperature lower than that of the inner heating wire 720 in the inner area 230.

In addition, when the boundaries between the first-first heating wire 710-1 to the first-fourth heating wire 710-4 are spaced apart from each other and are formed as the non-heating portions, the first-first heating wire 710-1 to the first-fourth heating wire 710-4 may have no thermal effect or only a very small effect on each other, which enables the first-first heating wire 710-1 to the first-fourth heating wire 710-4 and the respective inner areas 230 to be independently controlled.

Specifically, as illustrated in FIG. 3, the non-heating portion may be connected at one side thereof to the external power supply and may be electrically connected at the other side thereof to the outer heating wire 720, and the cable 800, which is not heated, may be disposed in the non-heating portion.

The cable 800 may not be configured as an electric heating wire and may be mainly provided to electrically interconnect the external power supply and the outer heating wire 720.

The outer heating wire 720, as illustrated in FIG. 3, may be disposed in a number and position corresponding to those of the respective divided outer areas 220 so as to independently heat the respective divided outer areas 220.

Here, opposite ends of the outer heating wire 720 configured as an electric heating wire may be electrically connected to respective cables 800 disposed in the non-heating portion so as to be heated upon receiving power from the external power supply via the cables 800.

For example, the outer heating wire 720 may be disposed to correspond to each of the four divided outer areas 220 of the susceptor 200. That is, the outer heating wire 720 may be divided into a second-first heating wire 720-1, a second-second heating wire 720-2, a second-third heating wire 720-3, and a second-fourth heating wire 720-4.

Here, the second-first heating wire 720-1 may be disposed in the first outer area 220-1 to heat the first outer area 220-1. In addition, the second-second heating wire 720-2 may be disposed in the second outer area 220-2 to heat the second outer area 220-2.

In addition, the second-third heating wire 720-3 may be disposed in the third outer area 220-3 to heat the third outer area 220-3. In addition, the second-fourth heating wire 720-4 may be disposed in the fourth outer area 220-4 to heat the fourth outer area 220-4.

The second-first heating wire 720-1 to the second-fourth heating wire 720-4 may independently heat the first outer area 220-1 to the fourth outer area 220-4.

That is, the second-first heating wire 720-1 to the second-fourth heating wire 720-4 may be independently connected to the external power supply, and may independently receive power under the control of the control device, which controls the external power supply, to heat the first outer area 220-1 to the fourth outer area 220-4.

Meanwhile, the external power supply and the control device may be independently electrically connected to each of the inner heating wire 710 and the outer heating wire 720, and may be provided in a plural number as needed.

For example, the control device may control the external power supply to supply the same magnitude or different magnitudes of power to the second-first heating wire 720-1 to the second-fourth heating wire 720-4 so that the first outer area 220-1 to the fourth outer area 220-4 are heated to a uniform temperature, thereby allowing the entire outer area 220 to be heated to a uniform temperature.

In particular, the outer heating wire 720 may heat respective corner portions of the outer areas 220. Thus, when the respective corner portions of the outer areas 220, which are easily cooled due to the sharp shape thereof, are independently heated by the outer heating wires 720, the susceptor 200 may be heated at a uniform temperature or may have only very slight temperature variation therein over the entire area thereof.

In addition, although not illustrated, a portion of the outer heating wire 720 in at least one outer area 220 may be located in the outer rim of the substrate 10 so as not to overlap the substrate 10. This serves to adjust the temperature of the outer rim of the substrate 10 because the outer rim portion of the substrate 10 may be easily cooled.

In addition, a portion of the outer heating wire 720 in at least one outer area 220 may be maintained at a temperature higher than that of the outer heating wire 220 in the inner area 230, i.e. the cable 800 under the control of the control device.

In an embodiment, at least some portions of the inner heating wire 710 may be disposed in the same inner area 230 at a first distance D1, and the respective inner heating wires 710 disposed in different inner areas 230 may be disposed at a second distance D2 in the portions thereof that are parallel to each other. For example, the portions of the inner heating wires 710 that have a zigzag shape or a wavy shape may be disposed at the first distance D1.

In an embodiment, the portions of the inner heating wire 710 and the outer heating wire 720 that are parallel to each other may be disposed at a third distance D3.

In an embodiment, the first distance D1 may be smaller than the second distance D2. This serves to cause the portion of the susceptor 200 that corresponds to the second distance D2 and the inner area 230 to have the same temperature or similar temperatures, thereby allowing the entire susceptor 200 to exhibit a uniform temperature.

That is, since the cable 800 is disposed in the portion that corresponds to the second distance D2 and generates Joule heat, the portion that corresponds to the second distance D2 may generate a greater amount of heat than the inner area 230.

Thus, when the first distance D1 is smaller than the second distance D2, the temperature, which is obtained by the heat of the inner heating wire 710 in the portion that corresponds to the second distance D2, may be lower than the temperature of the inner area 230.

However, since the cable 800 disposed in the portion that corresponds to the second distance D2 generates heat, such heat generation may compensate for the temperature difference between the portion that corresponds to the second distance D2 and the inner area 230.

That is, since both the inner heating wire 710 and the cable generate heat in the portion that corresponds to the second distance D2, whereas only the inner heating wire 710 generates heat in the inner area 230, when the first distance D1 is smaller than the second distance D2, the amount of heat generated in each portion may be adjusted, which may allow the portion that corresponds to the second distance D2 and the inner area 230 to have the same temperature or similar temperatures.

In an embodiment, the first distance D1 may be equal to or less than the third distance D3. This serves to prevent or alleviate an instantaneous temperature increase in the outer area 220.

The side surface of the susceptor 200 may be exposed to outside air in the outer area 220, and therefore may be more easily cooled than the inner area 230. Thus, the outer heating wire 720 disposed in the outer area 220 may be provided so as to generate a greater amount of heat than the inner heating wire 710.

Assuming that the outer heating wire 720 disposed in the outer area 220 is not easily cooled by outside air, the outer area 220, in which the outer heating wire 720 is disposed, may be instantaneously increased in temperature, which may cause uneven temperature distribution between the outer area 220 and the inner area 230.

In order to solve such temperature unevenness, the first distance D1 may be equal to or less than the third distance D3, and with this structure, heat transfer from the inner heating wire 710 to the outer area 220 is suppressed, whereas heat transfer from the outer heating wire 720 to the inner area 230 is increased, which may effectively prevent or alleviate an instantaneous temperature increase in the outer area 220.

In an embodiment, the second distance D2 may be equal to or greater than the third distance D3. This serves to achieve a uniform temperature over the entire susceptor 200.

In the susceptor 200, as described above, both the inner heating wire 710 and the cable 800 generate heat in the portion that corresponds to the second distance D2, and both the inner heating wire 710 and the outer heating wire 720 may generate heat in the portion that corresponds to the third distance D3.

Referring to FIG. 3, for example, two inner heating wires 710 and two cables 800 generate heat together in the portion that corresponds to the second distance D2, and one inner heating wire 710 and one outer heating wire 720 generate heat together in the portion that corresponds to the third distance D3.

Thus, the amount of heat generated in the portion that corresponds to the second distance D2 may be greater than the amount of heat generated in the portion that corresponds to the third distance D3, which may cause uneven temperature distribution over the entire susceptor 200.

Thus, in an embodiment, the second distance D2 may be equal to or greater than the third distance D3, which may ensure better heat transfer in the portion that corresponds to the second distance D2 and may ensure less heat transfer in the portion that corresponds to the third distance D3.

With this structure, the portion that corresponds to the second distance D2 and the portion that corresponds to the third distance D3 have the same temperature or similar temperatures, which may result in a uniform temperature over the entire susceptor 200.

Figure 4:
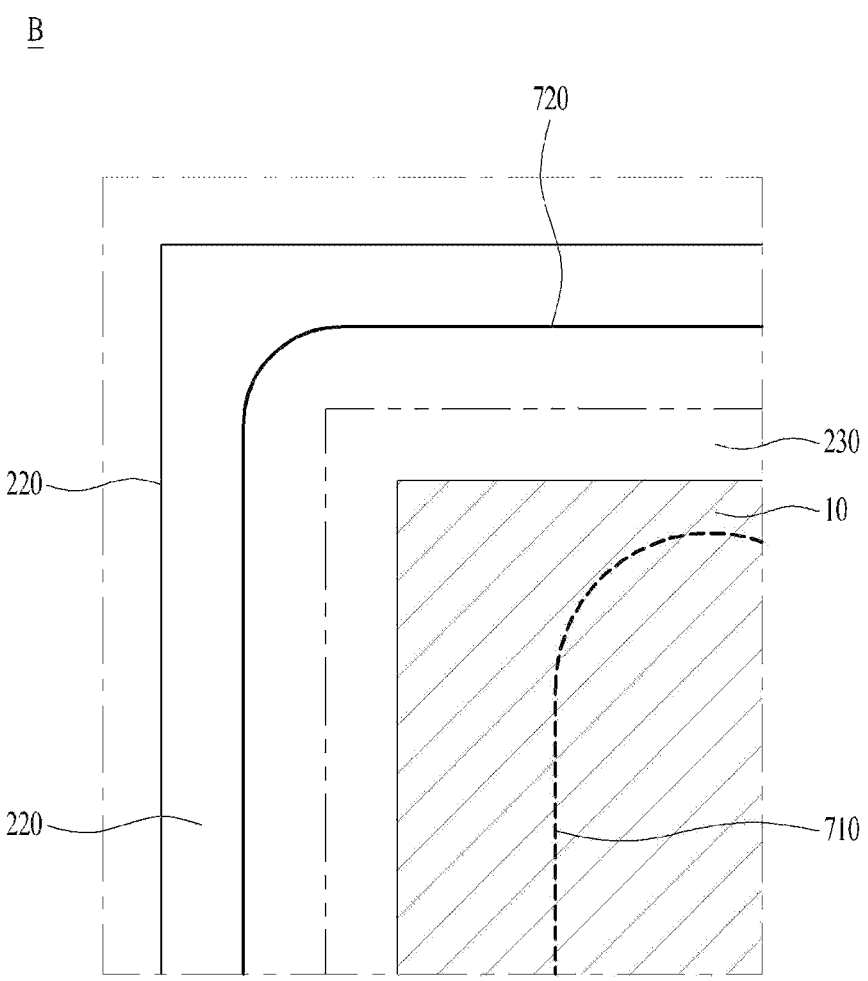
FIG. 4 is a view illustrating portion B of FIG. 3.

FIG. 4 is a view illustrating portion B of FIG. 3. In an embodiment, as illustrated in FIG. 4, the corner portion of the substrate 10 may be spaced apart from the outer area 220 and may be disposed in the inner area 230.

For example, when the substrate 10 has an angled shape, heat transfer may actively occur outward in the corner portion, and the inner heating wire 710 may not supply sufficient heat to the corner portion. Thus, the corner portion of the substrate 10 may be more cooled than the other portion, which may result in a defective product.

Therefore, in order to prevent thermal imbalance between the corner portion of the substrate 10 and the other portion due to the cooling of the corner portion, the corner portion of the substrate 10 may be disposed in the inner area 230, and the temperature of the outer heating wire 720, which is disposed in the outer area 220, which is spaced apart from the corner portion of the substrate 10, may be appropriately controlled so that heat generated from the outer heating wire 720 is transferred to the corner portion of the substrate 10 through the susceptor 200 via conduction.

With this structure, the outer heating wire 720 may appropriately control the temperature of the corner portion of the substrate 10, thereby preventing the occurrence of a defective product and enabling the control of characteristics of a finished substrate product, such as, for example, a thin film transistor (TFT), manufactured via processing such as, for example, deposition, in the manufacturing stage.

Figure 5:
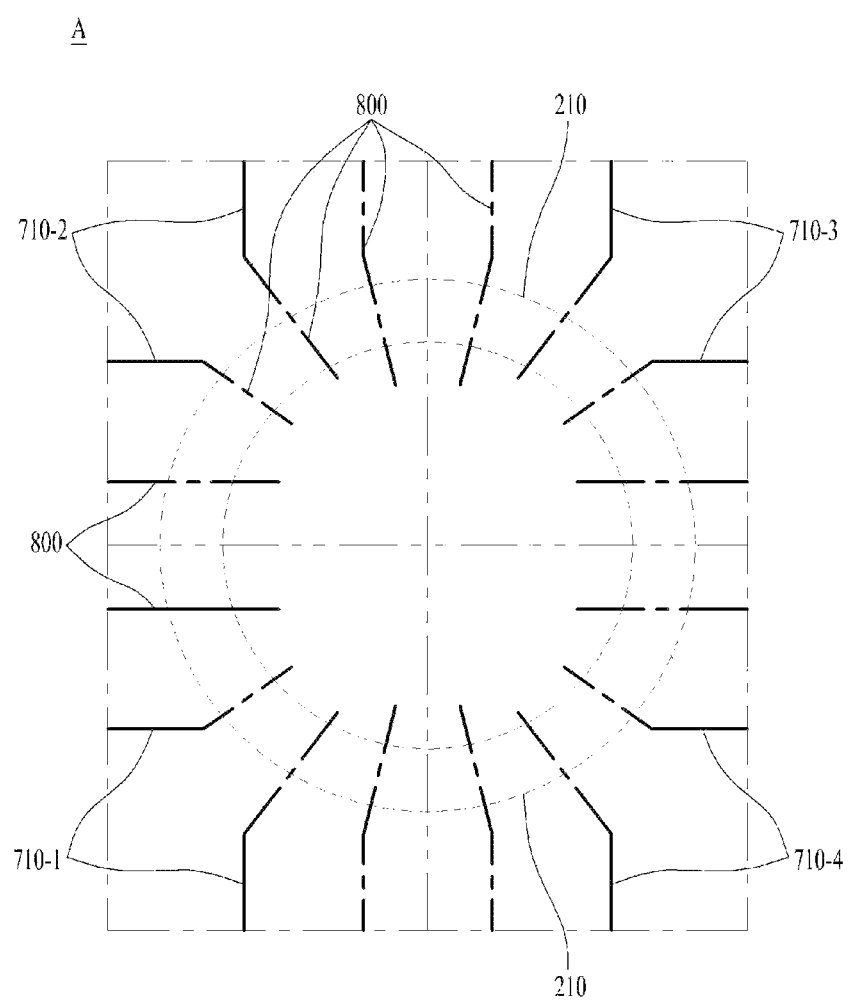
FIG. 5 is a view illustrating portion A of FIG. 3.

FIG. 5 is a view illustrating portion A of FIG. 3. In an embodiment, as illustrated in FIG. 5, the elevating device 210 may be provided in the center portion of the susceptor 200 to support and vertically move the susceptor 200. The elevating device 210 may have a bore therein. That is, the elevating device 210 may take the form of a hollow cylinder.

Here, respective electric heating wires, which form the inner heating wire 710 and the outer heating wire 720, may be connected to the respective cables 800 disposed in the bore of the elevating device 210 so as to be electrically connected to the external power supply and the control device.

Here, as described above, the respective electric heating wires may be electrically connected to the external power supply and the control device so that heating temperatures thereof are independently controlled.

For example, in an embodiment, all of the first-first heating wire 710-1 to the first-second heating wire 710-2, which heat the inner areas 230, and the second-first heating wire 720-1 to the second-second heating wires 720-2, which heat the outer areas 220, i.e. a total of eight heating units 700 may be independently provided on the susceptor 200.

Thus, opposite ends of each of the electric heating wires, which constitute the total of eight heating units 700, may be connected to the external power supply and the control device by a pair of cables 800. Thus, as illustrated in FIG. 5, a total of eight pairs of cables 800 may be disposed in the bore of the elevating device 210.

The total of eight pairs of cables 800 may independently electrically connect the eight heating units 700 to the external power supply and the control device. With this configuration, the eight heating units 700 may independently receive power and be heated by the external power supply and the control device.

Each heating unit 700 may be heated via independent and appropriate temperature control so that the entire area of the susceptor 200 may be heated at a uniform temperature or may have only very slight temperature variation therein.

For example, when the outer area 220, which is more rapidly cooled than the inner area 230, is set so as to be heated to a higher temperature, the inner area 230 and the outer area 220 of the susceptor 200 may have a uniform temperature or may have only very slight temperature variation therein.

In an embodiment, when the entire area of the susceptor 200 is maintained at a uniform temperature or with only very slight temperature variation therein, the uniformity of the temperature of the entire susceptor 200 may be increased.

In addition, when the susceptor 200 may be divided into the outer area 220 and the inner area 230 and each of the outer area 220 and the inner area 230 may be divided into a plurality of areas, it is possible to individually adjust the temperatures of the respective areas.

In particular, since the respective temperatures of the outer areas 220 of the susceptor 200 may be individually adjusted, the temperature of the corner portions of the substrate 10 close to the outer areas 220 may be easily adjusted, which enables adjustment in the device characteristics of a finished substrate product.

Although several embodiments have been described above, various other embodiments are also possible. The technical description of the embodiments described above may be combined in various forms so long as they are not incompatible, and thus, new embodiments may be implemented.

INDUSTRIAL APPLICABILITY

In the embodiments, the entire area of a susceptor is maintained at a uniform temperature or with only very slight temperature variation therein, which improves the uniformity of the temperature of the entire susceptor.

The invention claimed is:

1. A susceptor disposed in a substrate processing apparatus,
   wherein the susceptor is divided into a plurality of inner areas and a plurality of outer areas arranged adjacent to and between respective inner areas of the plurality of inner areas and edges of the susceptor, each inner area having an inner heating wire and each outer area having an outer heating wire, wherein a portion of each outer heating wire is located in an inner area,
   wherein, within each inner area of the plurality of inner areas, all portions of the inner heating wire parallel to one another in the same inner area are spaced apart from each other along a first direction by a first distance,
   wherein at least two inner areas of the plurality of inner areas are adjacent to one another and, within the at least two inner areas, some portions of the adjacent inner heating wires are parallel to one another and are spaced apart from each other along a second direction by a second distance,
   wherein, within an inner area and an outer area adjacent to the inner area, a portion of the inner heating wire and a portion of the outer heating wire are parallel to one another and are spaced apart from each other along the first direction by a third distance,
   wherein the first distance is less than the third distance, and
   wherein the second distance is greater than the third distance.

2. The susceptor according to claim 1, wherein the portion of each outer heating wire located in the inner area is not heated.

3. The susceptor according to claim 1, wherein a portion of the outer heating wire in at least one outer area is located in an outer rim of a substrate so as not to overlap the substrate so as to compensate for a temperature in the outer rim of the substrate.

4. The susceptor according to claim 1, wherein the portion of the outer heating wire in at least one outer area is maintained at a temperature higher than that of another portion of the outer heating wire in the inner area.

5. The susceptor according to claim 1, wherein a portion of the outer heating wire in at least one inner area is maintained at a temperature lower than that of the inner heating wire in the inner area.

6. The susceptor according to claim 1, wherein the outer area includes a plurality of outer areas that are independently heated.

7. The susceptor according to claim 1, wherein the inner areas include quadrants.

8. The susceptor according to claim 1, wherein the outer area is divided into quadrants.

* * * * *